(12) United States Patent
Brackley et al.

(10) Patent No.: US 7,722,256 B2
(45) Date of Patent: May 25, 2010

(54) FLAT SURFACE AIR BEARING ASSEMBLY

(75) Inventors: Douglas E Brackley, Horseheads, NY (US); David Lee Drum, Hammondsport, NY (US); Paul J McCarthy, Stratford, CT (US)

(73) Assignee: Corning Incorporated, Corning, NY (US)

( * ) Notice: Subject to any disclaimer, the term of this patent is extended or adjusted under 35 U.S.C. 154(b) by 646 days.

(21) Appl. No.: 11/601,347

(22) Filed: Nov. 17, 2006

(65) Prior Publication Data
US 2008/0117551 A1 May 22, 2008

(51) Int. Cl.
*F16C 32/06* (2006.01)
(52) U.S. Cl. ..................................... 384/12
(58) Field of Classification Search ............. 384/7, 384/12; 414/676
See application file for complete search history.

(56) References Cited

U.S. PATENT DOCUMENTS

| 3,250,573 A | 5/1966 | Clarke et al. |
| 3,558,295 A | 1/1971 | Bezombes et al. ............ 65/66 |
| 6,359,686 B1 * | 3/2002 | Ariglio et al. ............ 356/239.1 |
| 6,513,796 B2 | 2/2003 | Leidy et al. .................... 267/21 |
| 7,329,299 B2 | 2/2008 | Moriya et al. ............ 55/385.6 |
| 7,530,778 B2 * | 5/2009 | Yassour et al. ............ 414/676 |

FOREIGN PATENT DOCUMENTS

GB  2220157  1/1990

* cited by examiner

*Primary Examiner*—Thomas R Hannon
(74) *Attorney, Agent, or Firm*—Thomas R. Beall; Gibson & Dernier LLP

(57) ABSTRACT

An air bearing assembly includes: an upper portion having a plurality of air supply and vacuum holes therethrough; a lower portion; and a plurality of spacers disposed between and maintaining the upper and lower portions in spaced relation, wherein a density of the air supply and vacuum holes is high enough to provide an air bearing for a substrate, but low enough such that at least one of: (i) a sufficient number of the spacers are employed, and (ii) the spacers are located in close enough proximity, to maintain a substantially uniform flatness of the upper portion relative to the lower portion.

16 Claims, 6 Drawing Sheets

FLAT SURFACE AIR BEARING ASSEMBLY

BACKGROUND OF THE INVENTION

The present invention relates to an air bearing assembly, and more specifically, an air bearing assembly used for processing or measuring flat substrates.

Flat substrates, such as glass substrates, may be checked for stress deformation after cutting or any other process that may affect the quality of the substrate on an air bearing assembly. The air bearing assembly is typically a singular piece of granite having a flat upper surface. The granite is usually very thick to ensure that a solid, stable, and flat platform is obtained. Typically, it is desirable to apply air pressure (or another fluid) or to create a vacuum pressure between the substrate and the upper surface of the air bearing assembly. The vacuum pressure and air pressure is delivered by a combination of air and vacuum holes placed throughout the air bearing surface assembly. The vacuum pressure and air pressure is used to secure the substrate (e.g., for testing purposes) or to float the substrate at a specified fly height above the air bearing assembly for the purposes of manipulation and inspection.

Air pressure and vacuum pressure are applied to the substrate via air holes and vacuum holes, respectively. The air and vacuum holes are arranged throughout the air bearing assembly to ensure proper fly height, as well as maintaining the flatness of the substrate. Without the vacuum holes, air pressure is more likely to build up at the center of the substrate because air provided via the air holes does not readily escape from between the substrate and the air bearing assembly. In contrast, air more easily escapes past the edges of the substrate. A buildup of air pressure at the center of the substrate causes bowing and deformation of the substrate. Vacuum pressure provided via the vacuum holes helps prevent the build up of excess air pressure at the center of the substrate. Thus, flatness of the substrate is controlled by maintaining even pressure across the entire surface of the substrate via the air and vacuum holes.

Typically, the air and vacuum holes extend through the entire thickness of the air bearing assembly, which again is very thick. Unfortunately, boring the air and vacuum holes through the entire assembly weakens the overall structural integrity of the air bearing assembly. Further, it is exceedingly difficult to bore a small diameter hole through a hard substance such as granite. Among the problems encountered with drilling such holes is the likelihood of the hole not extending in a proper axial direction (such as perpendicular to the flat upper surface of the granite), the holes being of improper cross-sectional shape (e.g., oval instead of circular), or the drill bit used to bore the hole being damaged. As the overall structural integrity of the air bearing assembly is important for maintaining a stable, flat upper surface of the assembly (e.g., to manipulate and process the substrate), the conventional surface assembly has not been entirely satisfactory.

Thus, there is a need in the art for an air bearing assembly that allows individual air and vacuum lines to be installed within the assembly without having to bore through the entire thickness of the assembly.

SUMMARY OF THE INVENTION

A flat surface air bearing assembly and a method for assembling the same is described. The air bearing assembly comprises an upper portion having a substantially flat top surface for supporting a substrate, a lower portion for providing rigidity and support to the upper portion, and a plurality of spacers, situated between the upper portion and the lower portion, for maintaining the upper portion and the lower portion in a spaced relation. The spacers allow for the placement of individual air lines and vacuum lines between the upper portion and the lower portion. These air and vacuum lines are used to control an air bed on a top surface of the upper portion of the air bearing assembly.

The method describes how to assemble an air bed assembly. Once assembled, the entire air bearing assembly provides the same rigidity as a single piece air bearing assembly, while allowing air services to reach the upper surface of the upper portion. The multiple piece base assembly allows for multiple small diameter holes in a thinner, upper portion of granite or similar material, and provides the proper rigidity to achieve low tolerance flatness on the upper surface of the base assembly.

Other aspects, features, and advantages of the present invention will be apparent to one skilled in the art from the description herein taken in conjunction with the accompanying drawings.

DESCRIPTION OF THE DRAWINGS

For the purposes of illustration, there are forms shown in the drawings that are presently preferred, it being understood, however, that the invention is not limited to the precise arrangements and instrumentalities shown.

DETAILED DESCRIPTION OF THE PREFERRED EMBODIMENTS

With reference to the drawings, wherein like numerals indicate like elements, there is shown in FIGS. 1-5 an air bearing assembly 100 from various viewpoints.

Figure 1:
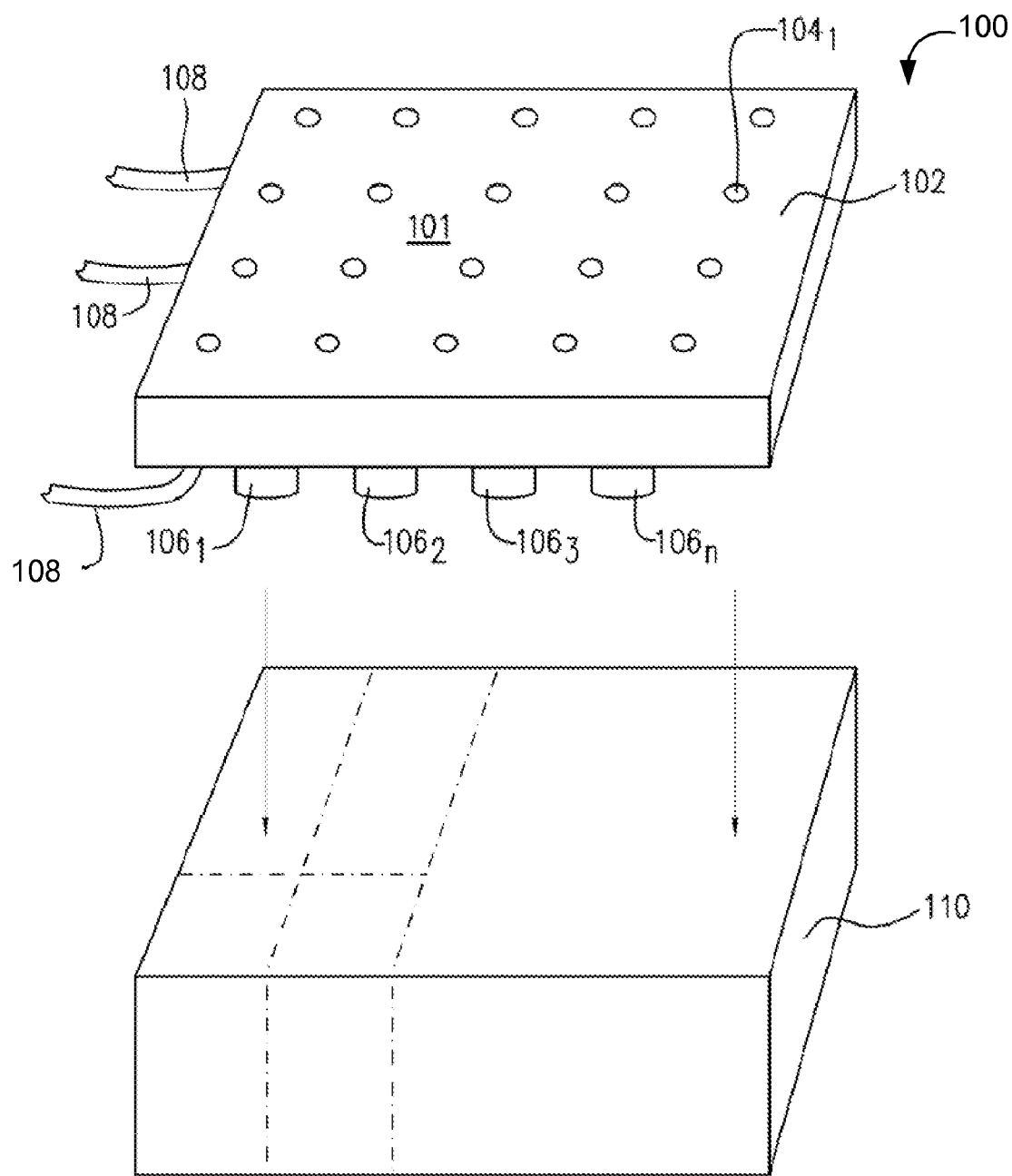
FIG. 1 is an exploded, perspective view of an air bearing assembly having a plurality of holes through an upper portion thereof in accordance with one or more embodiments of the present invention.

FIG. 1 is an exploded view of the air bearing assembly 100. The air bearing assembly 100 provides a substantially flat surface 101 from which to operate on a substrate (not shown) using an air cushion. The assembly 100 comprises an upper portion 102, a plurality of spacers 106, to 106, (collectively 106), a plurality of air/vacuum lines 108, to 108, (collectively 108), and a lower portion 110. These elements cooperate to support (e.g., float or secure in place) the substrate on a bed of air above the upper portion 102 of the assembly 100. The bed of air may be used for processes such as drying and curing of the substrate. The substrate may also be measured, cut to size, and inspected for stress fractures and other defects on the assembly. By way of example, the substrate may be a glass substrate, glass ceramic substrate, etc.

The upper portion 102 is seated upon the lower portion 110, and functionally separated from the lower portion by the plurality of spacers 106. In one or more embodiments of the invention, the upper portion 102 further comprises a plurality of holes (or bores) $104_1$ to $104_n$ (collectively 104) extending from the top surface 101 to the bottom surface 109 of the upper portion 102. The individual air/vacuum lines 108 are coupled to each hole 104 to provide air pressure and vacuum pressure to the top surface of the upper portion 102. In alternative embodiments, one air/vacuum line may service more than one hole 104 or more than one line 108 may service the same hole 104.

A density of the holes 104 is high enough to provide an air bearing for a substrate without being so high as to compromise the structural integrity of the upper portion 102 particularly when the upper portion is formed from granite. The density of the holes 104 is also low enough such that a sufficient number of the spacers 106 are employed to maintain a substantially uniform flatness of the upper portion 102 relative to the lower portion 110. Alternatively or additionally, the density of the holes 104 is low enough such that the spacers 106 may be located in close enough proximity to maintain a substantially uniform flatness of the upper portion relative to the lower portion. In one or more embodiments, the placement and density of the holes 104 are such that the plurality of spacers 106 are disposed in a substantially uniform array. The placement and density of the holes 104 are such that a surface area of each spacer 106 is large enough to collectively support and maintain the substantially uniform flatness of the upper portion 102 relative to the lower portion 110.

The lower portion 110 may be thicker than the upper portion 102 of the assembly 100, and provides rigidity and support to the assembly 100. In one or more embodiments of the invention, the lower portion 110 may be about 0.7 meters or about 28 inches thick, and the upper portion may be about 10 inches thick. In one or more other embodiments of the invention, the lower portion 110 may be up to about 0.91 meters or about 36 inches thick, and the upper portion 102 may be from about 0.1 to 0.45 meters or about 4 to 18 inches thick; the salient feature being that the lower portion 110 is substantially thicker than the upper portion 102. The lower portion 110 may be made of granite or any other material capable of supporting the upper portion 102 of the assembly 100. In some cases, it may be difficult to obtain large surface area pieces of granite to form the lower portion 110 (or the upper portion 102). Thus, as an alternative embodiment as indicated by the dashed lines in FIG. 1, the lower portion 110 (or upper portion 102) may be made from several individual pieces (sections) of granite that are assembled and locked together to form the lower portion 110. Mechanical features may be employed to interlock the sections, such as dove-tail joints or other mechanical alternatives. If glue is used to assist in the interlocking of the sections, then an acceptable granite glue is available from TRU-STONE of Waite Park, Minnesota.

Figure 3:
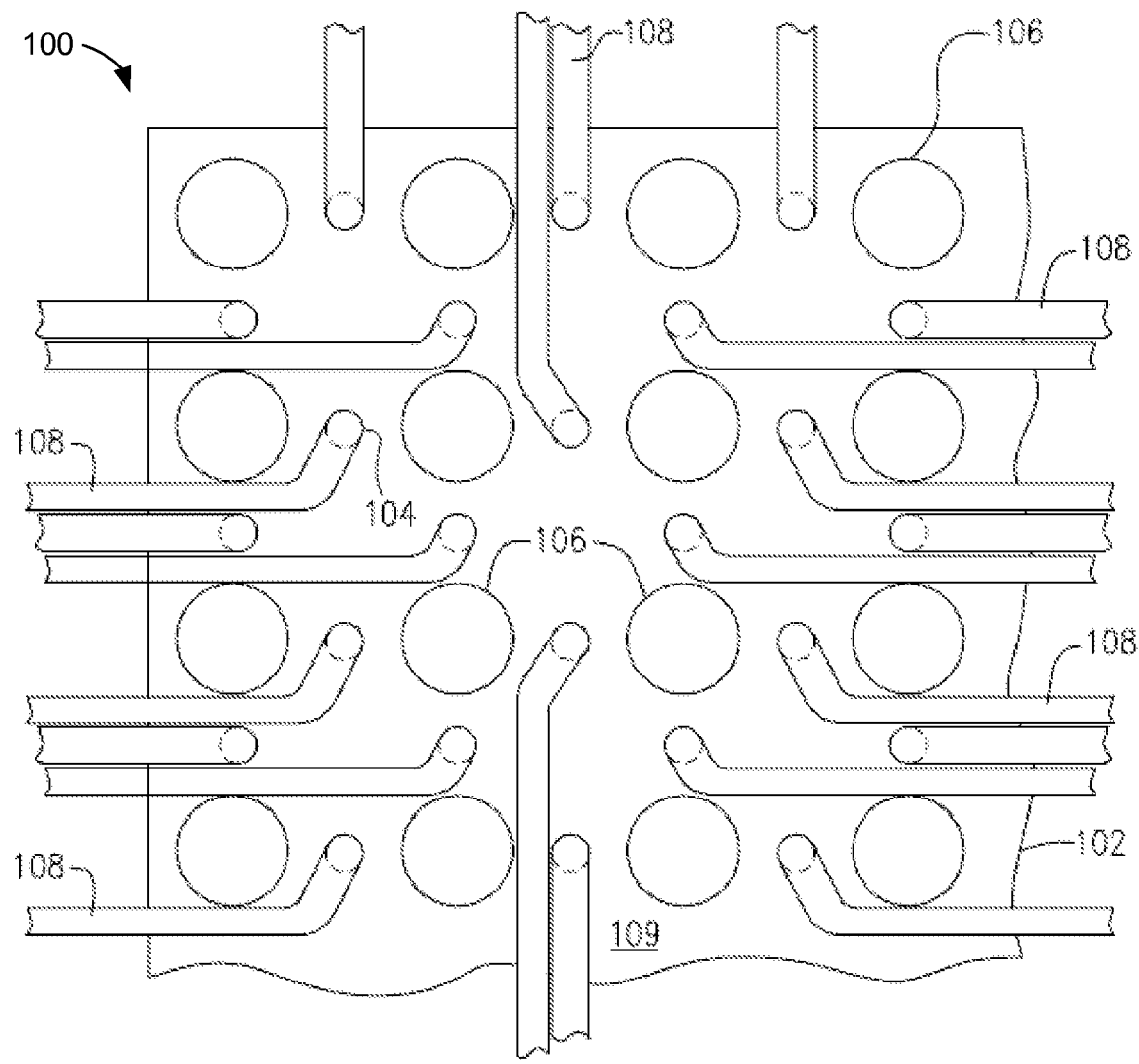
FIG. 3 is a plan view of a bottom surface of the upper portion of the air bearing assembly of FIG. 1.
Figure 4:
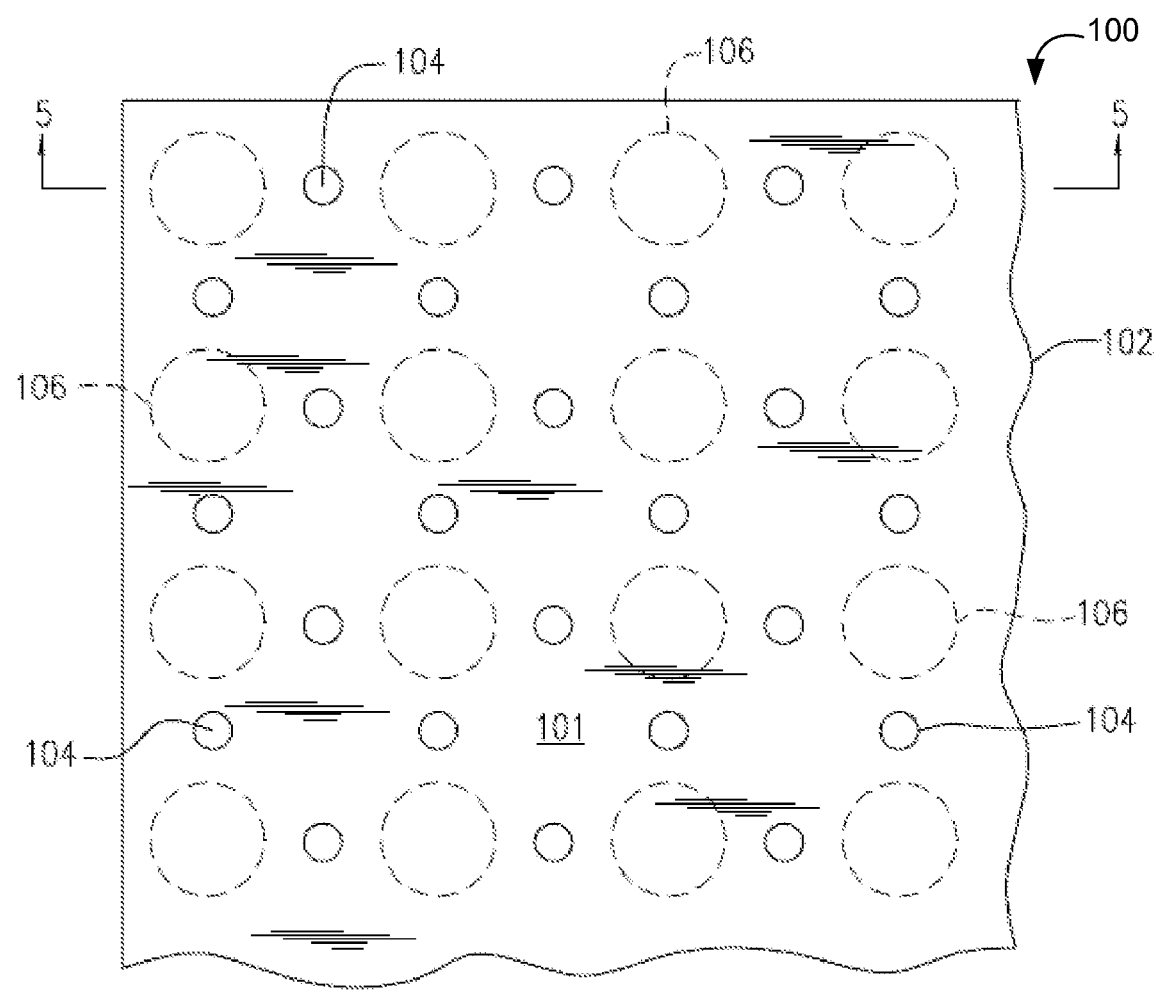
FIG. 4 is a plan view of a top surface of the upper portion of the air bearing assembly shown FIG. 1.

The upper portion 102 may be substantially thinner than the lower portion 110 and made of a hard, flat substance such as granite. The substantial flatness of the top surface 101 of the upper portion 102 helps maintain the flatness of the substrate supported by the upper portion 102. For example, the flatness of the upper portion is about 50 micrometers or less. In one or more embodiments of the invention, as best seen in FIG. 3, the plurality of spacers 106 are directly or indirectly attached to the bottom surface 109 of the upper portion 102, and arranged in such a manner that the spacers do not interfere with the plurality of holes 104 and the air/vacuum lines 108 coupled to each hole 104.

Figure 2:
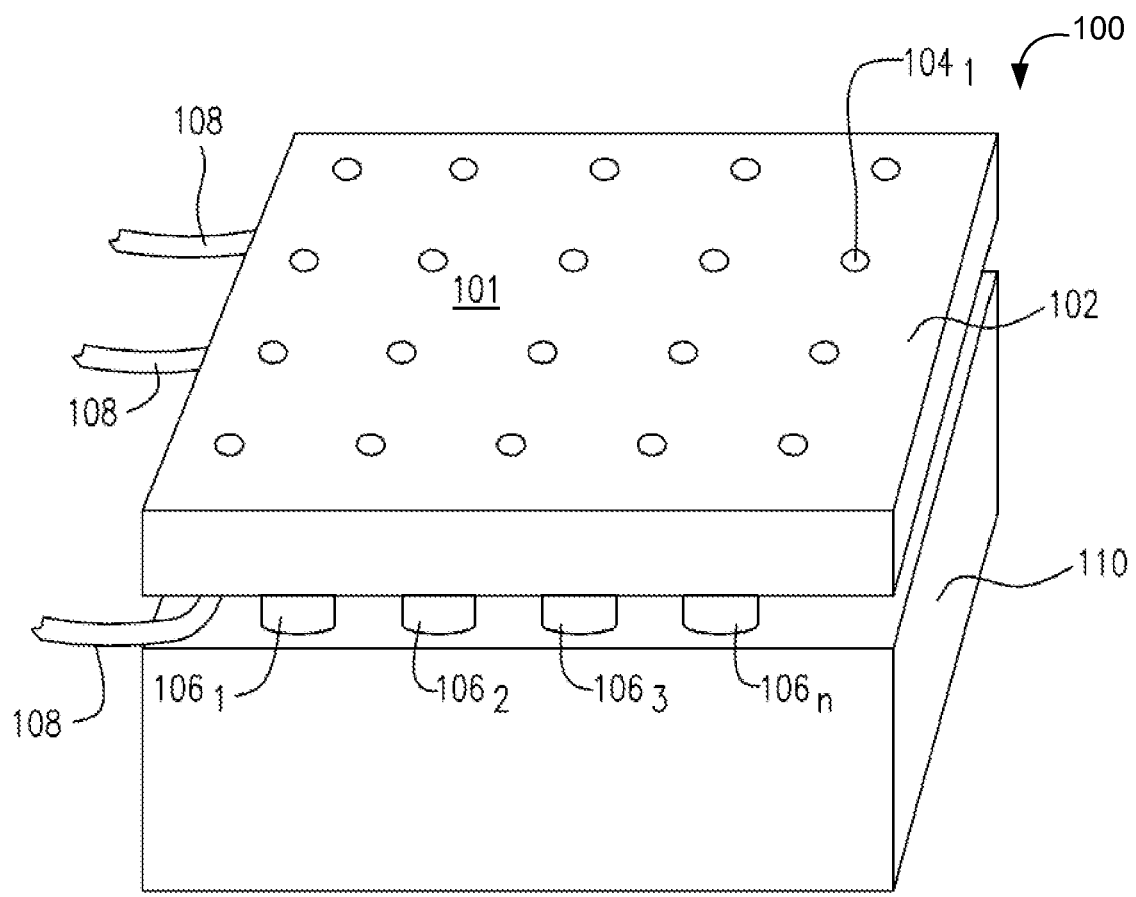
FIG. 2 is an assembled view of the air bearing assembly of FIG. 1.

The spacers 106 support the upper portion 102 in a spaced apart relationship with respect to the lower portion 110. Thus, the upper portion 102 is not in direct contact with the lower portion 110 when the air bearing assembly 100 is fully assembled. As best seen in FIGS. 2-3, the spacers 106 allow for the air/vacuum lines 108 to enter into the volume created by the spacers 106 between the lower portion 110 and the upper portion 102 and couple to their respective holes 104. The spacers 106 may be formed from any hard, flat substance such as granite. The spacers 106 may also be formed from milled grooves that are integral with the top surface of the lower portion 110 and/or the bottom surface of the upper portion 102. It is noted that only three air/vacuum lines 108 are shown in FIG. 2, although those skilled in the art will appreciate that any number of lines 108 may be employed without departing from the spirit and scope of the invention.

The spacers 106 may be any combination of shape, height and surface area, as long as the spacers 106 are operable to maintain the lower portion 110 and the upper portion 102 of the assembly 100 in a spaced relationship. As discussed above, the surface area of each spacer 106 should be large enough to collectively support and maintain the substantially uniform flatness of the upper portion 102 relative to the lower portion 110. In one or more embodiments, each spacer 106 may have a surface area contacting the upper or lower portion 102, 110 from about 0.016 to 0.08 square meters or 25 to 125 square inches. In one or more embodiments of the invention, the spacers 106 may be substantially cylindrical, about 1.5 inches in height, and about 3 inches in diameter. In one or more other embodiments of the invention, the spacers 106 may be from about 0.05 to 0.15 meters or 2 to 6 inches in diameter, and from about 0.025 to 0.15 meters or 1 to 6 inches in height. It is noted that the spacers 106 need not be cylindrical; rather, they may take on any suitable shape consistent with the purpose and function described above.

The air/vacuum lines 108 are coupled to the holes 104. Again, the air/vacuum lines 108 may be individually attached to each hole 104 as best seen in FIG. 3, they may service more than one hole 104, or more than one line 108 may service the same hole 104. The air/vacuum lines 108 are used to provide air pressure, vacuum pressure, or a combination of both to the top surface 101 of the upper portion 102 of the assembly 100. At least some, and potentially all of the air/vacuum lines 108 may be individually controllable such that the amount of pressure or vacuum to the associated holes 104 may be adjusted. In this way, the air/vacuum lines 108 are collectively used to control the air bed on the top surface 101 of the upper portion 102. The airbed floats the substrate above the upper portion 102 at a specified (and controllable) fly height. Even pressure along the entire substrate is maintained by controlling the combination of air floating the substrate upward, and vacuum pressure pulling the substrate downward. The combination of air pressure and vacuum pressure may also function to dry or cure the substrate. The air/vacuum lines 108 may be made of a material such as stainless steel or plastic.

Figure 5:
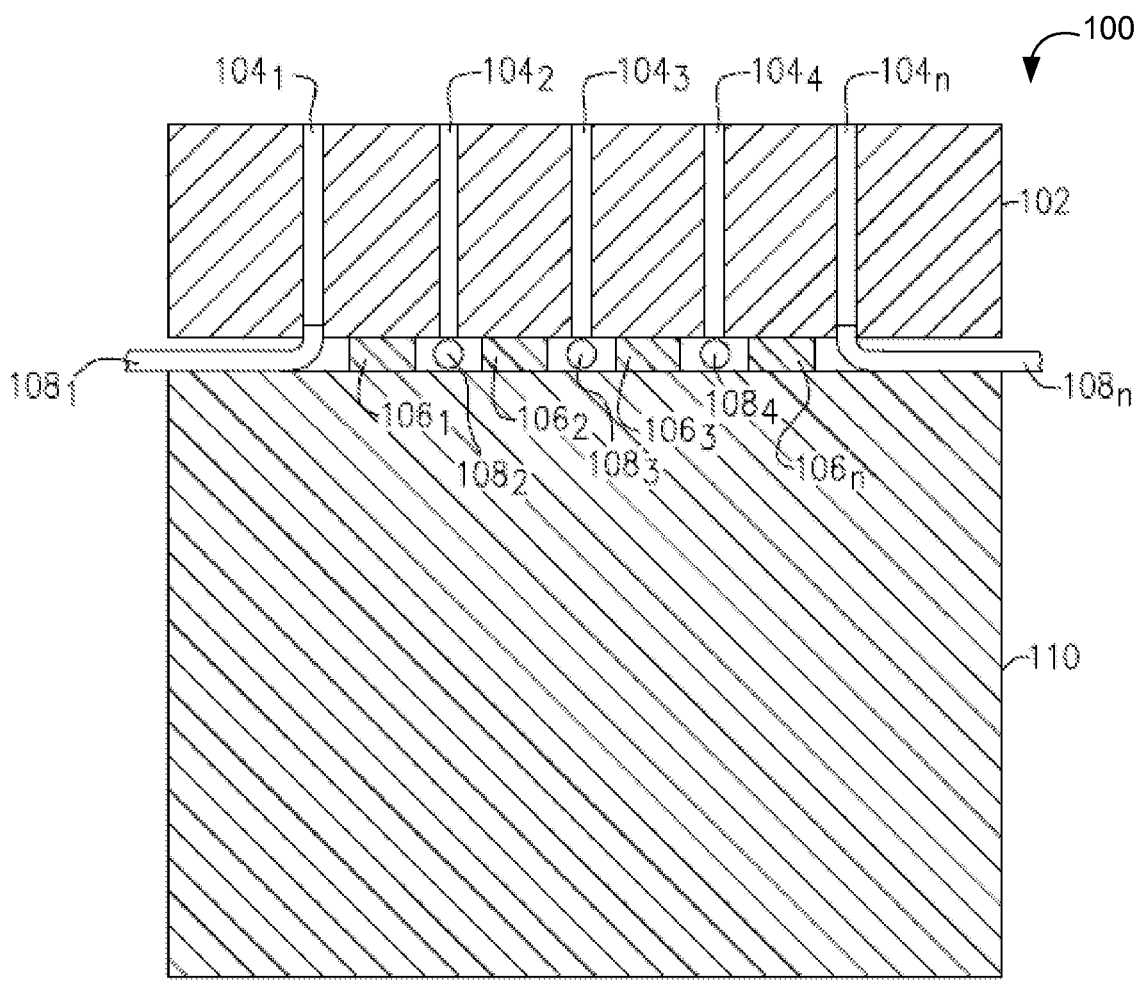
FIG. 5 is a cross sectional view of the air bearing assembly shown in FIG. 1.

With reference to FIG. 5, which is a cross-sectional view of the assembly 100, the holes 104 extend from the top surface 101 to the bottom surface 109 of the upper portion 102. In one or more embodiments of the invention, the holes 104 range from about 0.030 to 0.75 inches in diameter. As best seen in FIG. 3, the holes 104 are arranged in such a manner that their placement does not interfere with the placement of the spacers 106 on the bottom surface 109 of the upper portion 102. The placement and density of the spacers 106 and the placement and density of the holes 104 are such that the plurality of air supply and vacuum lines 108 are routed from the holes 104 through channels formed between the upper portion 102, the lower portion 110, and the spacers 106 and out from between the upper and lower portions 102, 110. Notably, the holes 104 do not extend into or through the bottom portion 110. Although the invention is not limited to any theory of operation, limiting the holes 104 to the relatively thinner upper portion 102 of the assembly 100 is believed to ensure a more structurally sound system as compared to the conventional assemblies.

In one or more alternative embodiments of the invention, the upper portion 102 may include at least a portion thereof that is permeable to gas, obviating the need for holes 104 at least in a particular area. Such gas permeable materials may be obtained, for example, from NEW WAY AIR BEARINGS of Aston, Pa. The assembly 100 functions in the same manner as above, with the upper portion 102 supported on the lower portion 110 by the spacers 106. The air/vacuum lines 108 are situated between the upper portion 102 and the lower portion 110, and provide air pressure, vacuum pressure, or a combination of both to the top surface of the upper portion 102 of the assembly 100. One or more of the air/vacuum lines 108 may supply air to the permeable portion. In some embodiments, separate bores (communicating with associated lines 108) may be provided through the permeable portion to provide vacuum to the top surface 101.

Figure 6:
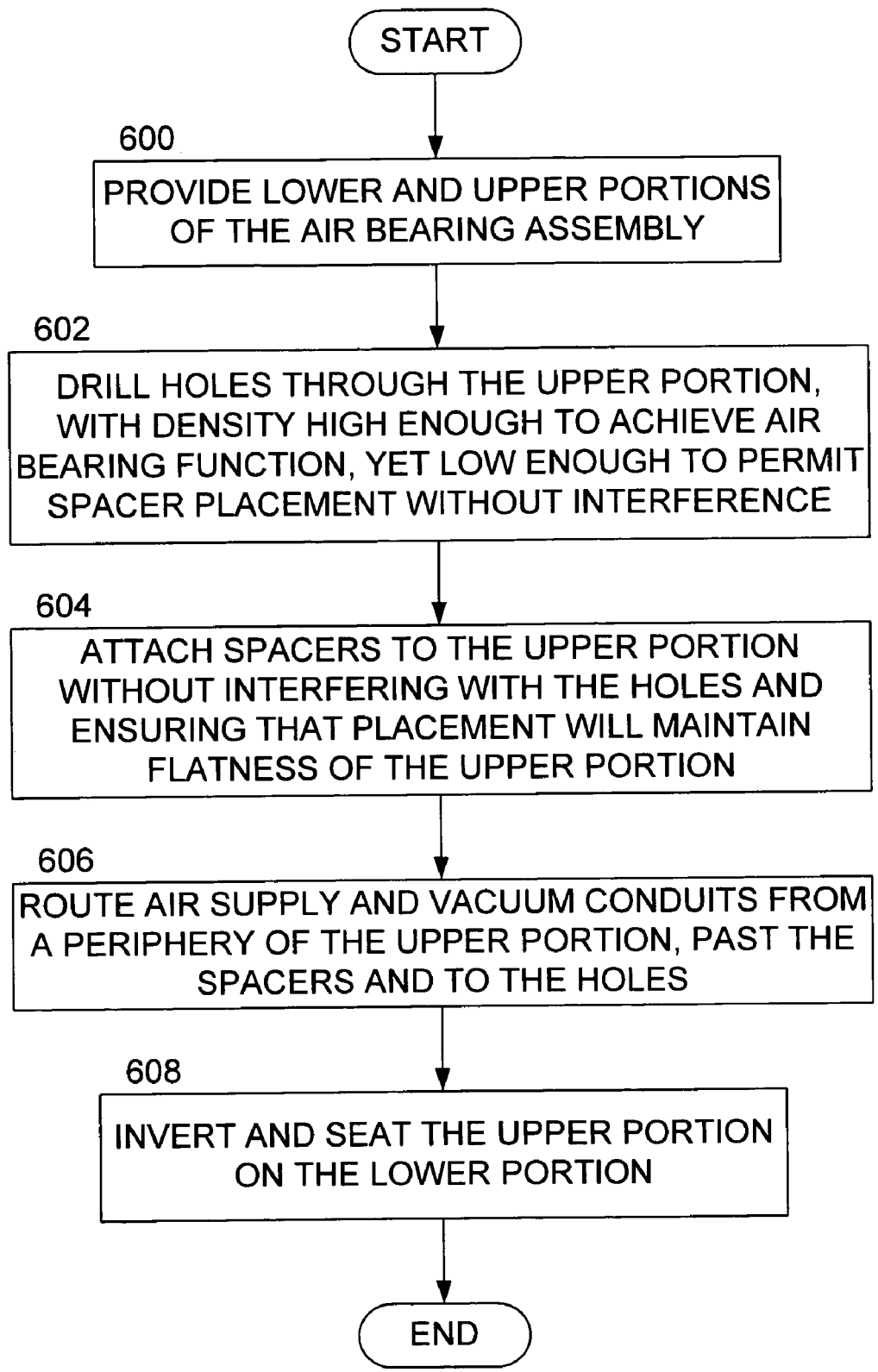
FIG. 6 is a flow diagram of a method for assembling the air bearing assembly shown in FIG. 1.

FIG. 6 is a flow diagram of a method for assembling the air bearing assembly 100. At step 600, the upper and lower portions 102, 110 of the air bearing assembly 100 are provided. At step 602, the holes 104 are drilled through the upper portion 102 at a sufficient density so as to ensure that an air bearing may be developed at the surface 101 to fly a substrate. The density of holes, however, is sufficiently low so as to ensure that a suitable number of spacers 106 may be disposed on a lower surface of the upper portion 102 without interfering with the holes 104. The number and placement of the spacers 106 (step 604) must maintain the upper portion 102 sufficiently flat when seated on the lower portion 110. At step 606, air supply and vacuum conduits 108 are routed from a periphery of the upper portion 102, past the spacers 106, to the holes 104. Notably, the relationship of the density of the holes 104 to the placement of the spacers 106 has an additional affect on the ability to route a sufficient number of conduits 108 to the holes 104. At step 608, the upper portion 102 of the assembly 100 is inverted and seated on the lower portion 110 of the assembly.

The lower portion 110 provides rigidity and support to the upper portion 102 via the spacers 106. The upper portion 102, spacers 106, and lower portion 110 may be glued or bonded together with glue, such as that from TRU-STONE described above. This approach to constructing the assembly 100 advantageously permits operators to form the holes 104 in the upper portion 102, place the spacers 106 and lines 108 in position, etc., without having to manipulate the rather large and cumbersome lower portion 110. Once these elements are coupled to the thinner upper portion 102, however, the more easily moved upper portion 102 may be seated on the lower portion 110.

One or more embodiments of the present invention provide an improved air bearing assembly. The multiple piece assembly 100 allows for multiple small diameter holes in a thinner, upper portion 102 of granite or similar material, and the lower portion 110 provides the proper rigidity to achieve low tolerance flatness on the upper surface 101 of the assembly 100. By dividing the assembly 100 into two separate pieces, the necessity to provide holes, e.g., air holes and vacuum holes (104), through the entire thickness of the assembly 100 is obviated. The spacers 106, strategically placed between the upper portion 102 and the lower portion 110 of the assembly 100, allow for the coupling of air/vacuum lines 108 to the holes 104 in the upper portion 102.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An air bearing assembly, comprising:
    an upper portion having a plurality of air supply and vacuum holes therethrough;
    a lower portion; and
    a plurality of spacers disposed between and maintaining the upper and lower portions in spaced relation,
    wherein a density of the air supply and vacuum holes is of a magnitude to provide an air bearing for a substrate and to maintain proximity and number of the spacers such that a substantially uniform flatness of the upper portion relative to the lower portion is ensured.

2. The air bearing assembly of claim 1, wherein the placement and density of the holes are such that the plurality of spacers are disposed in a substantially uniform array.

3. The air bearing assembly of claim 1, wherein the placement and density of the holes are such that a surface area of each spacer facilitates the spacer to collectively support and maintain the substantially uniform flatness of the upper portion relative to the lower portion.

4. The air bearing assembly of claim 3, wherein each spacer has a surface area contacting the upper or lower portion from about 25 to 125 square inches or 0.016 to 0.08 square meters.

5. The air bearing assembly of claim 3, wherein each spacer is substantially cylindrical in shape, from about 3 to 6 inches or 0.07 to 0.15 meters in diameter.

6. The air bearing assembly of claim 3, wherein each hole is from about 0.030 to 0.75 inches 0.0007 to 0.019 meters in diameter.

7. The air bearing assembly of claim 1, further comprising:
    a plurality of air supply and vacuum lines coupled to the holes,
    wherein the placement and density of the spacers and the placement and density of the holes are such that the plurality of air supply and vacuum lines are routed from the holes through channels formed between the upper portion, the lower portion, and the spacers and out from between the upper and lower portions.

8. The air bearing assembly of claim 1, wherein the upper and lower portions are formed from granite.

9. The air bearing assembly of claim 8, wherein the upper portion is substantially thinner than the lower portion.

10. The air bearing assembly of claim 9, wherein the upper portion is from about 4 to 18 inches thick, and the lower portion is from about 20 to 36 inches thick.

11. The air bearing assembly of claim 8, further comprising a plurality of air lines and a plurality of vacuum lines situated between the upper portion and the lower portion.

12. The air bearing assembly of claim 1, wherein the flatness of the upper portion is about 50 micrometers or less.

13. The air bearing assembly of claim 1, wherein the lower portion comprises a plurality of individual sections coupled together to form the lower portion.

14. An apparatus, comprising:
    an upper portion formed from granite an including a plurality of air supply and vacuum holes therethrough operable to produce an air bearing for a substrate;
    a lower portion formed from granite; and
    a plurality of spacers, situated between and maintaining the upper portion and the lower portion in a spaced relation such that the upper portion is substantially flat.

15. The apparatus of claim 14, wherein the holes extend through the upper portion but not the lower portion.

16. The apparatus of claim 14, wherein the upper portion is substantially thinner than the lower portion.

* * * * *

UNITED STATES PATENT AND TRADEMARK OFFICE
CERTIFICATE OF CORRECTION

PATENT NO. : 7,722,256 B2  Page 1 of 1
APPLICATION NO. : 11/601347
DATED : May 25, 2010
INVENTOR(S) : Douglas E. Brackley et al.

It is certified that error appears in the above-identified patent and that said Letters Patent is hereby corrected as shown below:

| Col. | Line | Description |
| --- | --- | --- |
| 2 | 50 | After "spacers", please delete "106" and add --$106_1$-- |
| 2 | 50 | After "to", please delete "106" and add --$106_n$-- |
| 2 | 51 | After "lines", please delete "108" and add --$108_1$-- |
| 2 | 51 | After "to", please delete "108" and add --$108_n$-- |

Signed and Sealed this

Seventeenth Day of August, 2010

David J. Kappos
*Director of the United States Patent and Trademark Office*